(12) United States Patent
Bakx

(10) Patent No.: US 6,559,713 B2
(45) Date of Patent: May 6, 2003

(54) SELF-TRACKING FILTER

(75) Inventor: Johannus Leopoldus Bakx, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/795,615

(22) Filed: Feb. 28, 2001

(65) Prior Publication Data

US 2001/0050994 A1 Dec. 13, 2001

(30) Foreign Application Priority Data

Mar. 3, 2000 (EP) .............................. 00200762

(51) Int. Cl.[7] .................................. H03K 5/00

(52) U.S. Cl. ....................................... 327/553

(58) Field of Search ................. 327/552, 553, 327/554, 555–559, 535

(56) References Cited

U.S. PATENT DOCUMENTS

| | | | |
|---|---|---|---|
| 3,638,037 A | 1/1972 | McMurtrie | 307/233 |
| 3,714,588 A | 1/1973 | Deboo et al. | 328/167 |
| 3,978,420 A | 8/1976 | Lane | 330/107 |
| 4,912,393 A | * 3/1990 | Anderson et al. | 327/535 |

FOREIGN PATENT DOCUMENTS

DE 4029975 A1 3/1992 ............. G11B/5/54

* cited by examiner

*Primary Examiner*—Dinh T. Le
(74) *Attorney, Agent, or Firm*—Michael E. Belk

(57) ABSTRACT

A self-tracking bandpass filter (1) comprises a controllable filter (10) having a signal input (11) for receiving a signal ($\phi$) to be filtered, a bandpass output (13) for providing a bandpass signal ($S_{BP}$) having a center frequency ($f_0$), and a control input (15) for receiving a control signal ($S_C$); and a control unit (20) coupled to the control input (15) of the controllable filter (10), adapted to generate the control signal ($S_C$) in such a way that the center frequency ($f_0$) of the bandpass characteristic ($H_B$) of the controllable filter (10) is substantially equal to the frequency (f) of the input signal ($\phi$).

15 Claims, 2 Drawing Sheets

SELF-TRACKING FILTER

BACKGROUND OF THE INVENTION

1. Technical Field

In one general aspect, the present invention relates to a filter circuit.

In the art, there is a general need for filtering signals. Especially, in situations where a signal comprises a main frequency component and disturbing frequency components at frequencies differing from the main frequency component, there is a need for filtering away the disturbing frequency components. If the disturbing frequency components are to be expected both at higher frequencies and at lower frequencies, relative to the main frequency component, the filter to use is a bandpass filter. If the main frequency is known in advance, persons skilled in the art will know how to design a bandpass filter circuit having a passband centered around the expected main frequency component. Depending on the requirements put on the filter, the width of the passband may be designed to be very narrow. However, if the main frequency is not exactly known in advance, for instance because the main frequency may vary within a relatively wide range, a narrow passband is not useful.

In another aspect, the present invention relates to a device for detecting zero-crossings in a signal.

In the art, there is a need for a reliable device for detecting zero-crossings in a signal. Although this need is a general need in the field of electronics, this need exists especially in the field of optical data devices, and therefore the present invention will, hereinafter, be explained in more detail for this specific practical example. However, it is stressed that the present invention is not limited to this example, but can be applied in a broader sense.

2. Related Art

Data recording media for recording information thereon in a plurality of substantially parallel tracks, or having information recorded thereon in a plurality of substantially parallel tracks, are commonly known, one typical example being an optical recordable CD. Information is recorded on such medium or read from such medium by means of an optical pick-up means, comprising a laser device which directs a laser beam towards the medium. The laser spot on the medium needs to follow the tracks accurately. Control of the pick-up position is performed by means of a tracking servo system, in which an error signal is developed which is indicative for the radial distance between the center of the track and the actual position of the laser spot, and the position of the pick-up means is adapted such as to minimize the error signal. Such a tracking servo system is commonly known per se, and need not be explained in more detail here.

An important feature of optical (or magnetic for that matter) recording media is that it is possible to steer the pick-up means directly to a desired track, as in contrast to conventional mechanical recording media where the information was recorded in one continuous spiral-shaped groove which should be followed by a needle. In order to be able to displace the pick-up means towards a desired track, it is at least necessary to have information available regarding the actual radial position of the pick-up means with respect to the target position of the desired track. When a control unit receives a command for displacing the pick-up means towards a new target track, the present position (present track) of the pick-up means is known. Basically, therefore, displacing the pick-up means towards the desired target track is performed by calculating the number of tracks between the present track and the target track, and to displace the pick-up means in such a way that the calculated number of tracks are skipped. Herein, it is necessary to detect the crossing of the tracks.

For this purpose, the above-mentioned error signal is used. During displacement of the pick-up means, the error signal is monitored; each time the error signal crosses zero, this occurrence is indicative for the crossing of a track. Therefore, it will be clear that, in order to be able to count the number of track-crossings accurately and in a reliable way, it is necessary to be able to detect the zero-crossings in the monitored error signal in a reliable way.

Although the method of detecting track-crossing by means of detecting zero-crossing and the error signal is known per se, for instance from German Offenlegungsschrift 40.29.975, the accuracy of the method is affected by disturbances in the error signal, which may cause a valid zero-crossing to be missed or an incorrect zero-crossing to be detected, and consequently causing the number of counted track-crossings to be incorrect. The disturbances in the error signal can have several causes.

One possible source of disturbances in the error signal is the presence of scratches or dust on the surface of the disc.

Another important source of disturbances is found in recordable optical media according to the ISO Standard. Such recordable optical medium comprises a so-called "pre-groove" or "pre-track", subdivided into sectors where information can be recorded. Each recordable sector is preceded by a sequence of preformatted pits, indicated as the "header", which includes the so-called "mirror mark", which is an interruption of the pre-groove. Depending on the speed and timing with which the spot crosses the mirror mark, a track may be missed or counted twice.

SUMMARY OF THE INVENTION

According to an important aspect of the present invention, the error signal is passed through a filter in order to eliminate disturbed signal components.

Generally, filter circuits can be divided into three categories: lowpass, highpass and bandpass.

Just using a simple low pass filter for filtering the error signal is insufficient if the access algorithm involves very high velocities. In that case, a fixed lowpass filter must accommodate the highest speed possible, and consequently the filtering at lower speed will be ineffective.

Apart from the above-indicated possible high-frequency disturbances, there are also potential sources for low-frequency disturbances, particularly disturbances that are synchronous with the disc rotation, such as reflection variations, radially orientated scratches, etc.

Another possible cause of disturbances in the error signal is an offset in the error signal, indicated as "baseline shift", that temporarily shifts the error signal above or below its normal baseline, which makes the zero-crossing in the error signal very vulnerable to noise.

Using a lowpass filter does not solve the problem caused by the above-mentioned baseline shift; for solving this type of problems, highpass filtering of the error signal is required.

Therefore, according to a further aspect of the present invention, it is possible to overcome the two above-mentioned problems simultaneously by using a bandpass filter for filtering of the error signal, preferably a narrow bandpass filter, the center frequency of which corresponds to the expected frequency of track-crossing during access. In this respect, as will be clear to a person skilled in the art, the expression "narrow" is to be understood as meaning just broad enough that that the expected track crossing frequency always lies within the passband, taking into account all tolerances and variations (component tolerances, track pitch variations, etc.).

In practice, the speed with which the pick-up means is displaced over the surface of the disc can vary widely. In a typical 3½ inch optical data disc with seek times of 30–40 ms, the frequency range of track crossings is from practically 0 to about 200 kHz. Therefore, in a further important aspect of the invention, the center frequency of the bandpass filter is controllable.

In principle, the drive means for displacing the pick-up means over the surface of the optical disc are controlled by a processor, which, inter alia, controls the speed of the pick-up means. In principle, such processor can also be used to set the center frequency of the bandpass filter; however, such setting would only be a rather coarse setting, and would not be accurate enough. Further, if for some reason an error would occur, and the center frequency setting of the bandpass filter would be erroneous to such extent that the output of the filter would become too small to provide reliable information, the control algorithm might crash.

Therefore, in a further aspect of the present invention, the bandpass filter is preferably self-tracking, i.e. it comprises a control loop which controls the center frequency of the bandpass filter and automatically adapts this center frequency to the frequency of the input signal.

BRIEF DESCRIPTION OF THE DRAWING

These and other aspects, characteristics and advantages of the present invention will be further clarified by the following description of a preferred embodiment of a control circuitry in accordance with the invention, with reference to the drawings, in which same reference numerals indicate equal or similar parts, and in which.

DETAILED DESCRIPTION OF THE INVENTION

Figure 1:
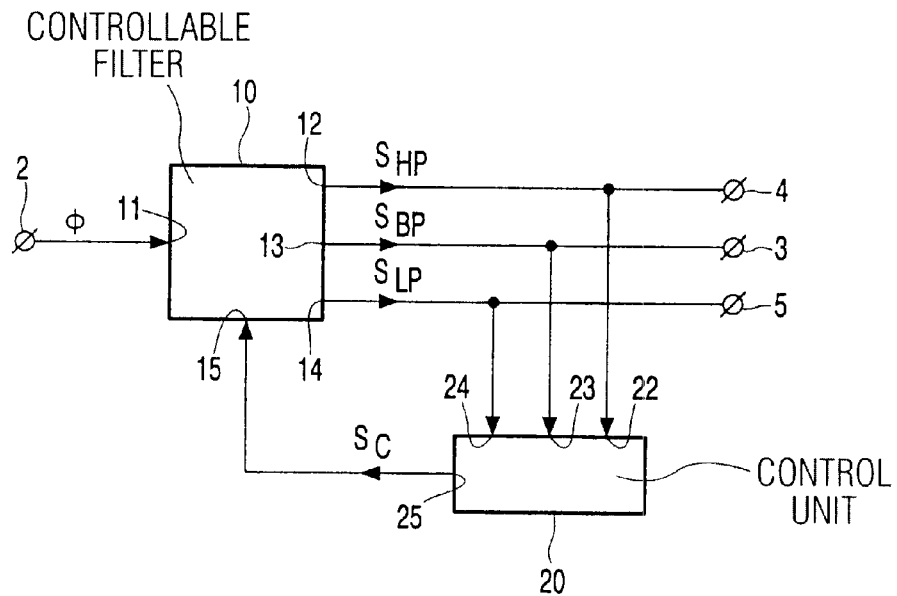
FIG. 1 schematically shows a block diagram of a self-tracking bandpass filter according to the present invention.

FIG. 1 schematically shows a block diagram of a self-tracking bandpass filter 1 according to the present invention, having a signal input 2 and a filtered signal output 3. The self-tracking bandpass filter 1 comprises a controllable filter 10 having a highpass output 12, a bandpass output 13, and a lowpass output 14, for providing a highpass signal $S_{HP}$, a bandpass signal $S_{BP}$, and a lowpass signal $S_{LP}$, respectively. The controllable filter 10 further comprises a signal input 11 coupled to the signal input 2 of the self-tracking bandpass filter 1 for receiving a signal $\phi$ to be filtered, and a control input 15 for receiving a control signal $S_C$. The self-tracking bandpass filter 1 further comprises a control unit 20 which, at signal inputs 22, 23, 24, respectively, receives the said output signals $S_{HP}$, $S_{BP}$ and $S_{LP}$ from the controllable filter 10, and which, based on these received signals, generates the control signal $S_C$ at a control signal output 25 for controlling the controllable filter 10.

In FIG. 1, the controllable filter 10 is illustrated as one filter having three outputs 12, 13, 14, one signal input 11, and one control input 15; however, the controllable filter 4 may also be implemented as a combination of three individual filters, each having their own signal input, control input, and filter output, as will be clear to a person skilled in the art.

Figure 2:
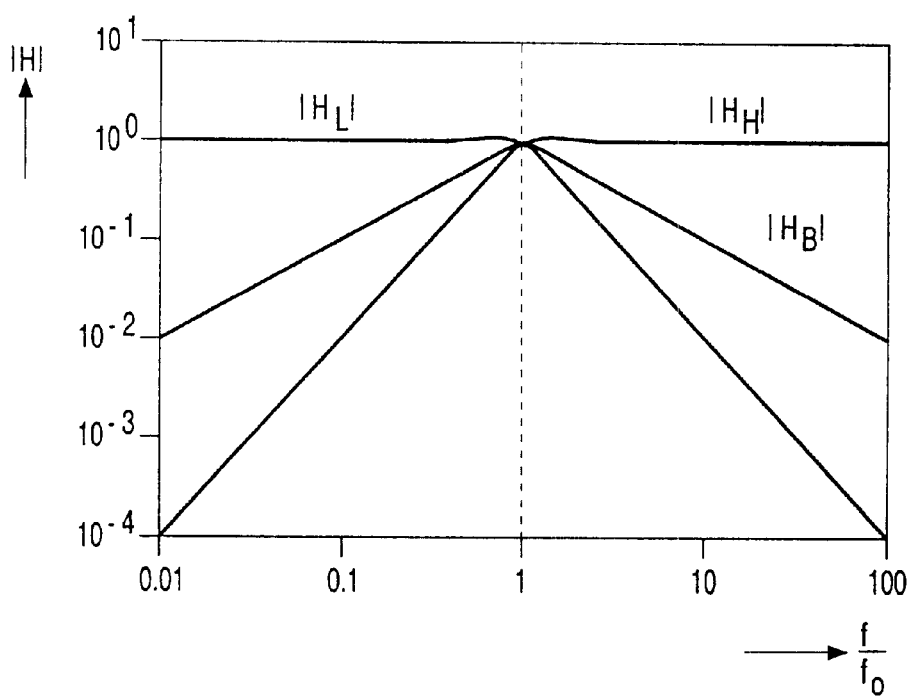
FIG. 2 is a graph illustrating transfer functions.

In the following, the amplitude of a signal S will be denoted as U(S). Further, a transfer function H for an output signal $S_{OUT}$ will be defined as $H \equiv |U(S_{OUT})|/|(U(\phi))|$. FIG. 2 is a graph illustrating the three transfer functions $H_H$, $H_B$, and $H_L$ for the three above-mentioned filter output signals $S_{HP}$, $S_{BP}$, and $S_{LP}$, respectively, plotted over each other. As usual, the transfer function $H_L$ for the lowpass output signal $S_{LP}$ is substantially constant for relatively low frequencies, and decreases with increasing frequency above a certain cutoff frequency $f_L$. Similarly, the transfer function $H_H$ for the highpass output signal $S_{HP}$ is substantially constant for relatively high frequencies, and decreases with decreasing frequency below a certain cutoff frequency $f_H$. Further, the transfer function $H_B$ for the bandpass output signal $S_{BP}$ has a maximum for a center frequency $f_0$, and decreases with decreasing frequency below and increasing frequency above said center frequency $f_0$. In this respect, the cutoff frequencies are the −3 dB frequencies, as will be clear to a person skilled in the art.

According to an important aspect of the present invention, the controllable filter 10 is designed such that said cutoff frequencies $f_H$ and $f_L$ and said center frequency $f_0$ can be controlled by a signal received at the control input 15.

According to a further important aspect of the present invention, the controllable filter 10 is designed such that, at all times, said cutoff frequencies $f_H$ and $f_L$ substantially coincide with said center frequency $f_0$ of the bandpass filter section of the controllable filter 4.

According to a still further important aspect of the present invention, the controllable filter 10 is designed such that, at all times, said three transfer functions $H_H$, $H_B$ and $H_L$ intersect each other, at least approximately, in one point for $f=f_0$. It will be clear to a person skilled in the art that, if the filter 10 does not have this characteristic as an intrinsic feature, this characteristic can easily be achieved by associating one or two output amplifiers with one or two, respectively, of the filter outputs 12, 13, 14, which can be set to compensate any deviation.

Then, as can easily be seen from FIG. 2, the following relationships are valid:

for $f<f_0$: $U(S_{LP})>U(S_{BP})>U(S_{HP})$             (1a)

for $f=f_0$: $U(S_{LP})=U(S_{BP})=U(S_{HP})$             (1b)

for $f>f_0$: $U(S_{LP})<U(S_{BP})<U(S_{HP})$             (1c)

The control unit 20 is arranged for using one or more of the above relationships for controlling the controllable filter 10 in such a way, that the amplitudes of the three filter output signals $S_{LP}$, $S_{BP}$ and $S_{HP}$ are substantially equal to each other, being indicative for the situation that $f_0$ is at least approximately equal to the frequency of the input signal $\phi$, implying that the output signal $S_{BP}$ at the output 3 of the self-tracking bandpass filter 1 is a reliable signal corresponding to the input signal $\phi$ in which disturbing signal components have been removed.

It is noted that it is not necessary that in each setting of the filter 10, as controlled by the control signal $S_C$, the values of $H_H$, $H_B$ and $H_L$ remain constant: these values may vary with f, as long as they vary in the same way.

Figure 3:
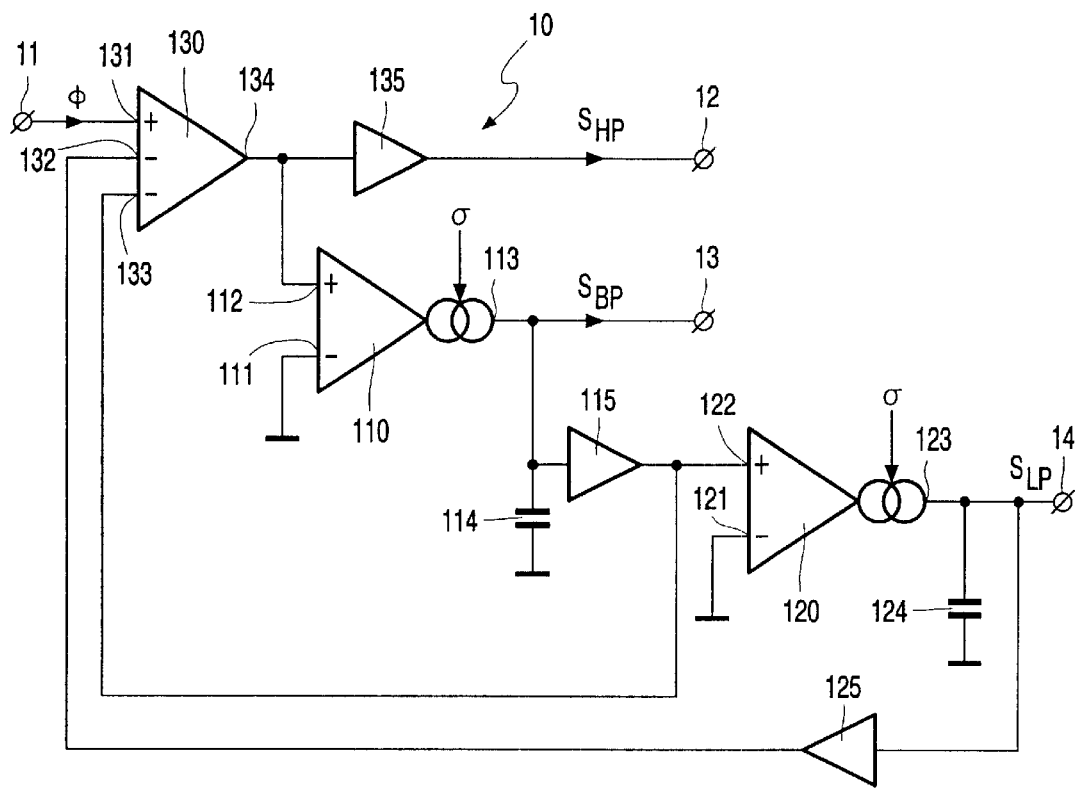
FIG. 3 is a block diagram of a controllable filter, applicable in the circuit of FIG. 1.

FIG. 3 is a schematical block diagram of a filter circuit implementing the controllable filter 10 of FIG. 1. The embodiment of FIG. 3 comprises two operational transconductance amplifiers (OTA) 110 and 120, each having an inverting input 111, 121, respectively, and each having a non-inverting input 112, 122, respectively, and each having an output terminal 113, 123, respectively.

An operational transconductance amplifier is a device arranged for generating at its output a current $I_{OUT}$ which is proportional to the voltage difference $U_{IN}$ between the two input terminals. Herein, the ratio $I_{OUT}/U_{IN}$ is defined as transconductance $\gamma$.

The associated transconductances of the OTAs 110, 120 are denoted as $\gamma_{110}$ and $\gamma_{120}$, respectively. The OTAs 110 and 120 are controllable OTAs in that their transconductance $\gamma_{110}$ and $\gamma_{120}$, respectively, can be varied by applying an external control signal $\sigma$.

The output 123 of the second OTA 120 is coupled to the lowpass output 14 of the controllable filter 10 for providing the lowpass output signal $S_{LP}$. The non-inverting input 122 of the second OTA 120 is coupled to the output 113 of the first OTA 110, which is coupled to the bandpass output 13 of the controllable filter 10 for providing the bandpass output signal $S_{BP}$. The non-inverting input 112 of the first OTA 110 is coupled to an output 134 of an input differential amplifier 130, which is coupled to the highpass output 12 of the controllable filter 10 for providing the highpass output signal $S_{HP}$.

More particularly, in this embodiment, the ratio between magnitude of the highpass output signal $S_{HP}$ on the one hand, and the signal received at the non-inverting input 112 of the first OTA 110, on the other hand, has a certain value $\alpha_{135}$. In FIG. 3, this is illustrated as a first amplifier 135 having a constant gain $\alpha_{135}$ being coupled between the output 134 of the input differential amplifier 130 and said highpass output 12, whereas the non-inverting input 112 of the first OTA 110 is connected directly to the output 134 of the input differential amplifier 130. As an alternative, the output 134 of the input differential amplifier 130 could be connected directly to said highpass output 12, whereas the non-inverting input 112 of the first OTA 110 could be coupled to the output 134 of the input differential amplifier 130 through an amplifier having a gain equal to $1/\alpha_{135}$. Further, said ratio does not need to be implemented by an active component such as an amplifier, but may also be provided by a passive component such as a resistance divider stage.

The input differential amplifier 130 has a non-inverting input 131 coupled to the signal input 11 of the controllable filter 10 for receiving the signal $\phi$ to be filtered. The input differential amplifier 130 further has a first inverting input 132 coupled to the output 123 of the second OTA 120, and a second inverting input 133 coupled to the output 113 of the first OTA 110; in other words, a first signal proportional to the lowpass output signal $S_{LP}$ on the one hand, and a second signal proportional to the bandpass output signal $S_{BP}$ on the other hand, are negatively fed back to the input of the circuit 10.

The inverting input 111 of the first OTA 110 is connected to a reference voltage, in this case ground; the same applies for the inverting input 121 of the second OTA 120. The output 113 of the first OTA 110 is connected to one terminal of a first capacitor means 114, the other terminal of which is connected to ground. The capacitance of said first capacitor means 114 is denoted as $C_{114}$. Further, the output 113 of the first OTA 110 is coupled to the non-inverting input 122 of the second OTA 120; similarly as described above with respect to the ratio $\alpha_{135}$, said coupling is illustrated in FIG. 3 as a second amplifier 115 having a gain denoted as $\alpha_{115}$. The output of this second amplifier 115 is shown coupled to the second inverting input 133 of the input differential amplifier 130.

Similarly, the output 123 of the second OTA 120 is connected to one terminal of a second capacitor means 124, the other terminal of which is connected to ground. The capacitance of said second capacitor means 124 is denoted as $C_{124}$. Further, the output 123 of the second OTA 120 is coupled to the first non-inverting input 132 of the input differential amplifier 130; similarly as described above with respect to the ratio $\alpha_{135}$, said coupling is illustrated in FIG. 3 as a third amplifier 125 having a gain denoted as $\alpha_{125}$.

In a preferred embodiment, the capacitance values $C_{114}$ and $C_{124}$ of the first capacitor means 114 and the second capacitor means 124, respectively, are substantially equal to each other, and are denoted as C.

Further, in this preferred embodiment, the ratios $\alpha_{115}$ and $\alpha_{125}$, respectively, are substantially equal to each other, and are denoted as $\alpha$, whereas the ratio $\alpha_{135}$ is substantially equal to $1/\alpha$.

Further, in this preferred embodiment, the transconductances $\gamma_{110}$ and $\gamma_{120}$ of the first OTA 110 and the second OTA 120, respectively, are substantially equal to each other, and are denoted as $\gamma$.

Using the usual Laplace notation, it can be shown that the highpass output $S_{HP}$, the bandpass output $S_{BP}$, and the lowpass output $S_{LP}$, respectively, relate to each other according to the following relationships:

$$U(S_{BP}) = \frac{\gamma}{sC}(U(\phi) - \alpha U(S_{LP}) - \alpha U(S_{BP})) \tag{2a}$$

$$U(S_{LP}) = \frac{\alpha\gamma}{sC}U(S_{BP}) \tag{2b}$$

It is noted that the above relationships (2a)–(2c) can be implemented by alternative circuit $$U(S_{HP}) = \frac{1}{\alpha}\frac{sC}{\gamma}U(S_{BP}) \tag{2c}$$

implementations, as will be clear to a person skilled in the art.

The transfer functions $H_H$, $H_B$ and $H_L$ for the highpass output, the bandpass output and the lowpass output, respectively, are given by the following relationships (3a)–(3c):

$$H_L(s) = \frac{\frac{1}{\alpha}}{s^2\tau^2 + s\tau + 1} \tag{3a}$$

$$H_B(s) = \frac{\frac{1}{\alpha}s\tau}{s^2\tau^2 + s\tau + 1} \tag{3b}$$

Herein, $\tau = C/\alpha\gamma$.

$$H_H(s) = \frac{\frac{1}{\alpha}s^2\tau^2}{s^2\tau^2 + s\tau + 1} \tag{3c}$$

The frequency response of this filter is shown in FIG. 2, wherein $\alpha$ is chosen to be equal to 1.
The horizontal axis of this graph represents the normalized frequency $f/f_0$, with $f_0 = \frac{1}{2}\pi\sigma$.

As indicated above, the relative magnitudes of the filter output signals $S_{HP}$, $S_{BP}$ and $S_{LP}$ are indicative for the relationship between the characterizing frequency $f_0$ of the filter on the one hand and the signal frequency f of the input signal φ on the other hand, in accordance with the above relationships (1a)-(1c).

Figure 4:
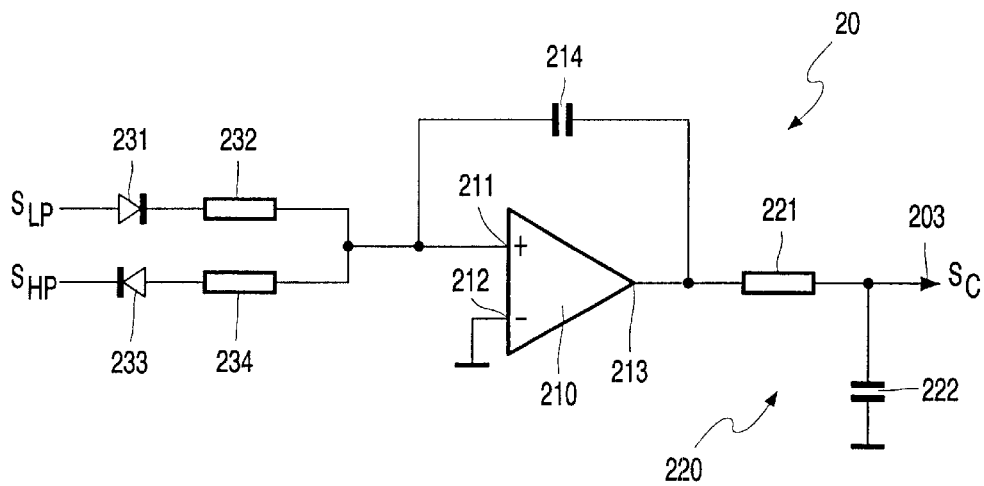
FIG. 4 is a block diagram of a control unit for generating a control signal for the controllable filter of FIG. 3.

Therefore, it follows that a control unit 20 can be implemented in a rather simple manner by comparing two of said filter output signals and generating a control signal $S_C$ for controlling the controllable OTAs 110 and 120. An example of such simple control unit 20 is shown in FIG. 4. This control unit 20 is a simple integrating controller comprising an amplifier 210 having a non-inverting input 211, an inverting input 212 connected to ground, and an output 213 coupled to the non-inverting input 211 by means of a capacitor means 214 having a capacitance $C_{214}$. The output 213 of this amplifier 210 is coupled to a control output 203 through an RC-filter 220 comprising a resistance means 221 connected in series and a capacitive means 222 connected in parallel. The non-inverting input 211 of the amplifier 210 is coupled to receive the lowpass signal $S_{LP}$ through a first diode 231 connected in series with a resistor 232 having a resistance value $R_{232}$. Similarly, the non-inverting input 211 of the amplifier 210 is coupled to receive the highpass signal $S_{HP}$ through a series connection of a second diode 233 and a resistor 234 having a resistance value $R_{234}$ substantially equal to $R_{232}$.

This control unit 20 provides a control signal $S_C$ at its output 203, which is coupled to the OTAs 110 and 120 for controlling the transconductance γ thereof.

In the above, it is explained that two of the filter output signals can be compared for deriving a control signal for controlling the transconductance γ of the two OTAs 110 and 120, while further this is explained with respect to an embodiment where the highpass signal $S_{HP}$ and the lowpass signal $S_{LP}$ are used as said two signals. The circuit can be slightly simplified by using the bandpass signal instead of the highpass signal, because then it is not necessary to generate the highpass signal. However, such would incur the risk that the control unit would not lock in situations where f is much greater than $f_0$, since then both the lowpass signal and the bandpass signal will have very small magnitude.

Thus, the present invention provides a bandpass output signal which, as long as the control unit is locked to the input frequency, will provide optimum response in a narrow frequency band centered around the input frequency f of the input signal φ, i.e. the track crossing frequency if the input signal φ is the error signal of an ODD. Moreover, the phase of the bandpass output signal will be equal to the phase of the input signal φ, which is important if a specific phase relationship with other optical signals is to be maintained.

It should be clear to a person skilled in the art that the scope of the present invention is not limited to the examples discussed in the above, but that several amendments and modifications are possible without departing from the scope of the invention as defined in the appending claims.

For instance, it is possible to achieve a higher-order filter characteristic by coupling more OTAs in series. Further, in the above, an embodiment is described wherein the control unit 20 only uses two of the output signals of the filter 10; in such case, the control unit 20 needs to have only two inputs 22 and 24.

Further, the principles of the present invention are also applicable for providing a self-tracking highpass filter or a self-tracking lowpass filter, respectively. For such purpose, it is noted that the highpass output signal $S_{HP}$ at highpass output 12 of the controllable filter 10 and the lowpass output signal $S_{LP}$ at output 14 of the controllable filter 10 are self-tracking signals in that their cutoff frequencies $f_H$ and $f_L$ follow the frequency of the input signal φ. Therefore, in FIG. 1, besides the self-tracking bandpass output 3, also a self-tracking highpass output 4 and a self-tracking lowpass output 5 of the self-tracking filter 1 are shown. However, it should be clear to a person skilled in the art that the self-tracking filter 1 may in practice have one of said outputs, or two of said outputs, or all three of said outputs, as desired.

What is claimed is:

1. Self-tracking filter, comprising:
   a controllable filter having a signal input for receiving a signal (f) to be filtered, a lowpass output for providing a lowpass signal ($S_{LP}$) having a cutoff frequency ($f_L$), a highpass output for proving a highpass signal (S) and a control input for receiving a control signal ($S_C$);
   a control unit coupled to the control input of the controllable filter, adapted to generate the control signal ($S_C$) such that the cutoff frequency ($f_L$) of the lowpass characteristic ($H_L$) of the controllable filter is substantially equal to the frequency (f) of the input signal (f), wherein the control unit comprises signal inputs for receiving the lowpass signal ($S_{LP}$) and the highpass signal ($S_{HP}$), respectively; and wherein the control unit (20) is adapted to compare the lowpass signal ($S_{LP}$) and the highpass signal ($S_{HP}$), and to generate the control signal ($S_C$) based on the result of the comparison.

2. Self-tracking filter, comprising:
   a controllable filter having a signal input for receiving a signal (f) to be filtered, a bandpass output for providing a bandpass signal ($S_{BP}$) having a center frequency ($f_0$), a highpass output for proving a highpass signal (S) and a control input for receiving a control signal ($S_C$);
   a control unit coupled to the control input of the controllable filter, adapted to generate the control signal ($S_C$) such that the center frequency ($f_0$) of the bandpass characteristic ($H_B$) of the controllable filter is substantially equal to the frequency (f) of the input signal (f), wherein the control unit comprises signal inputs for receiving the highpass signal ($S_{HP}$) and the bandpass signal ($S_{BP}$), respectively; and wherein the control unit is adapted to compare the highpass signal ($S_{HP}$) and the bandpass signal ($S_{BP}$), and to generate the control signal ($S_C$) based on the result of the comparison.

3. Filter according to claim 2, wherein the cutoff frequency ($f_H$) of the highpass signal ($S_{HP}$) of the controllable filter is substantially equal to the center frequency ($f_0$) of the bandpass signal ($S_{BP}$) for all values of the control signal ($S_C$) in a predetermined control range;
   wherein transfer function ($|H_B|$) of the bandpass signal ($S_{BP}$) pertaining to the controllable filter intersects transfer function ($|H_H|$) of the highpass signal ($S_{HP}$) pertaining to the controllable filter at the center frequency ($f_0$) of the bandpass signal ($S_{BP}$), and wherein the control unit is adapted to amend the control signal ($S_C$) such as to increase the center frequency ($f_0$) of the bandpass signal ($S_{BP}$) when the transfer function ($|H_B|$) of the bandpass signal ($S_{BP}$) is lower than the transfer function ($|H_H|$) of the highpass signal ($S_{HP}$), and to amend the control signal ($S_C$) such as to decrease the center frequency ($f_0$) of the bandpass signal ($S_{BP}$) when the transfer function ($|H_B|$) of the bandpass signal ($S_{BP}$) is higher than the transfer function ($|H_H|$) of the highpass signal ($S_{HP}$).

4. Filter according to claim 2, wherein a cutoff frequency ($f_L$) of a lowpass signal ($S_{LP}$) of the controllable filter and a cutoff frequency ($f_H$) of a highpass signal ($S_{HP}$) of the controllable filter are substantially equal to the center frequency ($f_0$) of the bandpass signal ($S_{BP}$) for all values of the control signal ($S_C$) in a predetermined control range;

wherein transfer function ($|H_H|$) of the highpass signal ($S_{HP}$)pertaining to the controllable filter intersects transfer function ($|H_L|$) of the lowpass signal ($S_{LP}$) pertaining to the controllable filter at the center frequency ($f_0$) of the bandpass signal ($S_{BP}$),and wherein the control unit is adapted to amend the control signal ($S_C$) such as to increase the center frequency ($f_0$) of the bandpass signal ($S_{BP}$) when the transfer function ($|H_H|$) of the highpass signal ($S_{HP}$) is higher than the transfer function ($|H_L|$) of the lowpass signal ($S_{LP}$), and to amend the control signal ($S_C$) such as to decrease the center frequency ($f_0$) of the bandpass signal ($S_{BP}$) when the transfer function ($|H_H|$) of the highpass signal ($S_{HP}$) is lower than the transfer function ($|H_L|$) of the lowpass signal ($S_{LP}$).

5. Filter according to claim 4, wherein the controllable filter comprises:

an input amplifier having a non-inverting input coupled for receiving the input signal (f), and having an output;

a first controllable OTA having a non-inverting input coupled to the output of the input amplifier, and having an output, a first capacitor means being coupled between said output of the first controllable OTA and a reference voltage;

a second controllable OTA having a non-inverting input coupled to the output of the first controllable OTA, and having an output a second capacitor means being coupled between said output of the second controllable OTA and said reference voltage;

wherein an output signal of said first OTA and an output signal of said second OTA are negatively fed back to inputs of the controllable filter.

6. Filter according to claim 5, wherein the output of the input amplifier is coupled to a highpass output; and/or wherein the output of the first controllable OTA is coupled to a bandpass output; and/or wherein the output of the second controllable OTA is coupled to a lowpass output.

7. Filter according to claim 6, wherein the output of the input amplifier is coupled to a highpass output through a first amplifier having a constant gain ($a_{135}$);

wherein the output of the first controllable OTA is coupled to the non-inverting input of the second controllable OTA through a second amplifier having a constant gain ($a_{115}$);

wherein the output of said second amplifier is coupled to an inverting input of the input amplifier; and wherein the output of said second OTA is coupled, through a third amplifier having a constant gain ($a_{125}$), to an inverting input of the input amplifier.

8. Filter according to claim 7, wherein $a_{115}$ is approximately equal to $a_{125}$ and approximately equal to $1/a_{135}$.

9. Filter according to any of claim 8, wherein the transconductance ($g_{110}$) of the first OTA is approximately equal to the transconductance ($g_{120}$) of the second OTA.

10. Filter according to any of claim 9, wherein the capacitance value ($©_{114}$) of the first capacitor means is approximately equal to the capacitance value ($©_{124}$) of the second capacitor means.

11. Filter according to any of the claim 10, wherein the control unit is an integrating controller comprising an amplifier having an input coupled to signal inputs of the control unit, an output coupled to said input through a capacitance, an RC-filter, and an output coupled to said controllable OTAs for controlling the transconductances ($g_{110}$, $g_{120}$) thereof.

12. Self-tracking filter, comprising:

a controllable filter having a signal input for receiving a signal (f) to be filtered, a bandpass output for providing a bandpass signal ($S_{BP}$) having a center frequency ($f_0$), a lowpass output for proving a lowpass signal (S) and a control input for receiving a control signal ($S_C$);

a control unit coupled to the control input of the controllable filter, adapted to generate the control signal ($S_C$) such that the center frequency ($f_0$) of the bandpass characteristic ($H_B$) of the controllable filter is substantially equal to the frequency (f) of the input signal (f), wherein the control unit comprises signal inputs for receiving the lowpass signal ($S_{LP}$) and the bandpass signal ($S_{BP}$), respectively; and wherein the control unit is adapted to compare the lowpass signal ($S_{LP}$) and the bandpass signal ($S_{BP}$), and to generate the control signal ($S_C$) based on the result of the comparison.

13. Filter according to claim 12, wherein a cutoff frequency ($f_L$) of the lowpass signal ($S_{LP}$) of the controllable filter is substantially equal to the center frequency ($f_0$) of the bandpass signal ($S_{BP}$) for all values of the control signal ($S_C$) in a predetermined control range;

wherein transfer function ($|H_B|$) of the bandpass signal ($S_{BP}$)pertaining to the controllable filter intersects transfer function ($|H_L|$)of the lowpass signal ($S_{LP}$) pertaining to the controllable filter at the center frequency ($f_0$) of the bandpass signal ($S_{BP}$), and wherein the control unit is adapted to amend the control signal ($S_C$) such as to increase the center frequency ($f_0$) of the bandpass signal ($S_{BP}$) when the transfer function ($|H_B|$) of the bandpass signal ($S_{BP}$) is higher than the transfer function ($|H_L|$) of the lowpass signal ($S_{LP}$), and to amend the control signal ($S_C$) such as to decrease the center frequency ($f_0$) of the bandpass signal ($S_{BP}$) when the transfer function ($|H_B|$) of the bandpass signal ($S_{BP}$) is lower than the transfer function ($|H_L|$) of the lowpass signal ($S_{LP}$).

14. Self-tracking filter, comprising:

a controllable filter having a signal input for receiving a signal (f) to be filtered, a highpass output for providing a highpass signal ($S_{HP}$) having a cutoff frequency ($f_H$), a lowpass output for proving a lowpass signal (S) and a control input for receiving a control signal ($S_C$);

a control unit coupled to the control input of the controllable filter, adapted to generate the control signal ($S_C$) such that the cutoff frequency ($f_H$) of the highpass characteristic ($H_H$) of the controllable filter is substantially equal to the frequency (f) of the input signal (f), wherein the control unit comprises signal inputs for receiving the lowpass signal ($S_{LP}$) and the highpass signal ($S_{HP}$), respectively; and wherein the control unit is adapted to compare the lowpass signal ($S_{LP}$) and the highpass signal ($S_{HP}$), and to generate the control signal ($S_C$) based on the result of the comparison.

15. Filter according to claim 14, wherein a cutoff frequency ($f_L$) of the lowpass signal ($S_{LP}$) of the controllable filter is substantially equal to the cutoff frequency ($f_H$) of the highpass signal ($S_{HP}$) of the controllable filter for all values of the control signal ($S_C$) in a predetermined control range;

wherein transfer function ($|H_H|$) of the highpass signal ($S_{HP}$)pertaining to the controllable filter intersects transfer function ($|H_L|$)of the lowpass signal ($S_{LP}$) pertaining to the controllable filter at said cutoff frequency ($f_H$) of the highpass signal ($S_{HP}$) and said cutoff frequency ($f_L$) of the lowpass signal ($S_{LP}$), and wherein the control unit is adapted to amend the control signal ($S_C$) such as to increase said cutoff frequencies ($f_H$; $f_L$) when the transfer function ($|H_H|$) of the highpass signal ($S_{HP}$) is higher than the transfer function ($|H_L|$) of the lowpass signal ($S_{LP}$), and to amend the control signal ($S_C$) such as to decrease said cutoff frequencies ($f_H$; $f_L$) when the transfer function ($|H_H|$) of the highpass signal ($S_{HP}$) is lower than the transfer function ($|H_L|$) of the lowpass signal ($S_{LP}$).

\* \* \* \* \*